United States Patent
Beanato et al.

(10) Patent No.: US 12,283,878 B2
(45) Date of Patent: Apr. 22, 2025

(54) METHOD FOR OPERATING A POWER ELECTRONIC CONVERTER, AND POWER ELECTRONIC CONVERTER

(71) Applicant: Hitachi Energy Ltd, Zürich (CH)

(72) Inventors: Giulia Beanato, Fahrweid (CH); Jerome Fischer, Egerkingen (CH); Simon Herold, Affoltern am Albis (CH); Martin Klaeusler, Rombach (CH); Luigi Lucano, Waldshut (DE)

(73) Assignee: Hitachi Energy Ltd, Zürich (CH)

( * ) Notice: Subject to any disclaimer, the term of this patent is extended or adjusted under 35 U.S.C. 154(b) by 442 days.

(21) Appl. No.: 17/613,377

(22) PCT Filed: May 20, 2019

(86) PCT No.: PCT/EP2019/062970
§ 371 (c)(1),
(2) Date: Nov. 22, 2021

(87) PCT Pub. No.: WO2020/233786
PCT Pub. Date: Nov. 26, 2020

(65) Prior Publication Data
US 2022/0216807 A1    Jul. 7, 2022

(51) Int. Cl.
*H02M 1/32*     (2007.01)
*H01L 23/473*   (2006.01)
(Continued)

(52) U.S. Cl.
CPC ............ *H02M 1/32* (2013.01); *H01L 23/473* (2013.01); *H02M 1/327* (2021.05); *H02M 7/4835* (2021.05); *H02M 7/53875* (2013.01)

(58) Field of Classification Search
CPC .... H02M 1/00; H02M 1/0003; H02M 1/0025; H02M 1/32; H02M 1/327; H02M 1/0085;
(Continued)

(56) References Cited

U.S. PATENT DOCUMENTS

| | | | |
|---|---|---|---|
| 2004/0131104 A1* | 7/2004 | Seferian | G01K 7/01 374/178 |
| 2018/0145579 A1* | 5/2018 | Spudic | H02M 7/4835 |
| 2019/0081551 A1* | 3/2019 | Hu | H02J 3/18 |

FOREIGN PATENT DOCUMENTS

EP   2783896 A1   10/2014

OTHER PUBLICATIONS

Goncalves, Jorge, et al., "Extension of Power Transmission Capacity in MMC-based HVDC Systems through Dynamic Temperature-Dependent Current Limits", 17th European Conference on Power Electronics and Applications, Geneva, Switzerland, Sep. 8-10, 2015, 10 pages.

(Continued)

*Primary Examiner* — Thienvu V Tran
*Assistant Examiner* — Carlos O Rivera-Perez
(74) *Attorney, Agent, or Firm* — Slater Matsil, LLP

(57) ABSTRACT

A method for operating a power electronic converter comprising at least one power semiconductor device is provided. The method comprises the determination of the at least one current limit, by carrying out a first operation if the temperature of the at least one semiconductor device is above an upper temperature threshold in order to decrease the current limit, and by carrying out a second operation if the temperature of the at least one semiconductor device is below a lower temperature threshold in order to increase the current limit.

20 Claims, 5 Drawing Sheets

Figure 1:
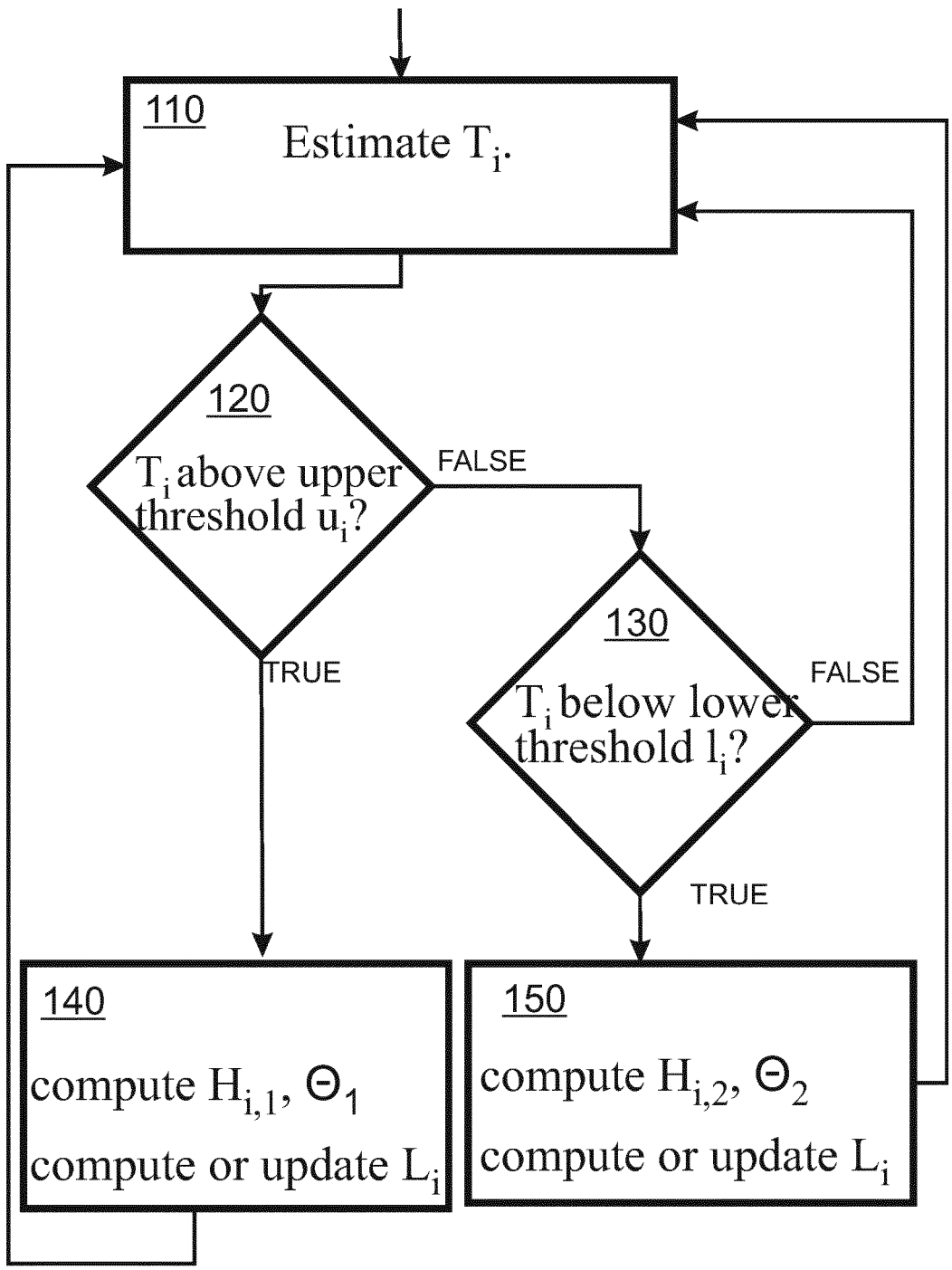

(51) Int. Cl.
*H02M 7/483* (2007.01)
*H02M 7/5387* (2007.01)

(58) Field of Classification Search
CPC ........ H02M 1/0095; H02M 7/42; H02M 7/44;
H02M 7/483; H02M 7/4833; H02M
7/4835; H02M 7/4837; H02M 7/487;
H02M 7/521; H02M 7/5387; H02M
7/53875; H01L 23/34; H01L 23/46; H01L
23/473; H03K 2017/08; H03K 2017/0806
USPC .... 363/15–17, 50–58, 95–99, 123, 131–134,
363/141; 323/266, 274–278, 284–286,
323/907; 361/103, 140
See application file for complete search history.

(56) References Cited

OTHER PUBLICATIONS

Munoz, Javier, et al., "Control of Multilevel STATCOMs", Power Systems, Chapter 8, Dec. 2015, pp. 265-311.
Murdock, Dustin A., et al., "Active Thermal Control of Power Electronic Modules", IEEE Transactions on Industry Applications, vol. 42, No. 2, XP-002516524, Mar./Apr. 2006, 7 pages.

\* cited by examiner

Unipolar cell

Bipolar cell

METHOD FOR OPERATING A POWER ELECTRONIC CONVERTER, AND POWER ELECTRONIC CONVERTER

CROSS-REFERENCE TO RELATED APPLICATIONS

This application is a national stage application of International Application No. PCT/EP2019/062970, filed on May 20, 2019, which application is hereby incorporated herein by reference.

TECHNICAL FIELD

Background

A power electronic converter is a device used to convert or transfer electric power. A power electronic converter may in particular receive as input power from a DC source, e.g. a DC voltage source and transfer the power to an AC load, producing as output an alternating current from the DC input. Vice versa a power electronic converter may receive power from an AC source as input and produce a DC current for a DC load as output. Thus a power electronic converter transfers power while converting a DC current to an AC current or vice versa. A power converter is not limited to the conversion from DC power to AC power or from AC power to DC power. Power converters can also conveniently be used for the conversion from AC power to other AC power, e.g. with a different frequency, of from DC power to DC power, e.g. with a different voltage.

A power electronic converter may store energy in one or more capacitors. Semiconductor switches are conveniently switched in order to transfer power from the input to the one or more capacitors and then from the one or more capacitors to the output. With a convenient arrangement of the one or more capacitors and the semiconductor switches it is possible to transfer to power from the input to the output of the converter using the one or more capacitors in the converter as intermediate energy storage elements while transferring the power.

The capacitors may be also used as a voltage source for producing a desired output voltage dependent on time through a convenient the switching of semiconductors in the converter.

Power electronic converters may have different topologies. E.g. a conversion from DC to 3-phase AC currents is possible or vice versa. Other polyphase currents can also be obtained, e.g. from DC or from 3-phase AC or vice versa. Power electronic converters may also be used to transfer power between different phases of a 3-phase or polyphase AC system, e.g. to compensate unbalances ensuring voltage stability or for other applications wherein a power transfer or power conversion in an AC polyphase system is demanded.

A power electronic converter allows a precise control of the output power or the generated output AC or DC voltages or currents, e.g. a power electronic converter may produce an AC signal with a desired frequency whereas in a transformer the frequency of the output signals is determined by the frequency of the applied input source. Moreover a power electronic converter may further be used in order to exchange inductive or capacitive reactive power in an AC energy system and in particular in a 3-phase or polyphase AC system.

A power electronic converter, as used in embodiments of the present invention, has semiconductor switches connected to capacitors functioning as intermediate energy storage elements and/or as voltage sources or sources of power for the power transfer or conversion.

The power electronic converter may be a modular multi-level converter and in particular a modular multi-level delta connected static synchronous compensator or a modular multi-level direct 3-phase to 1-phase converter. In particular in a modular multi-level converter capacitors may be used as voltage source in order to obtain a desired voltage level. Switching connections between capacitors using semiconductor elements it is possible to obtain a time dependent voltage level in order to e.g. produce an AC voltage from a DC voltage or vice versa or to transfer power between different phases e.g. in a 3-phase system.

Most components of the power electronic converters are subject to power losses occurring in operation. Those power losses widely depend on various operating conditions of the power converter. The power losses of the different components will eventually lead to an increase of the operating temperature of the component or some parts of the inner structure thereof. Typically, the components have a relatively strict range regarding the allowed operating temperature. Cooling systems are installed inside the power electronic converter to ensure that each component is operated within its specified temperature range. Further, in order to avoid overheating, the operation conditions of the power converter are restricted such that the temperature of all components is kept within its specified limits.

For this purpose the vendor of the power electronic converter or the vendor of a semiconductor used in the power electronic converter is typically specifying limits regarding the operation of the power converter, such as maximum converter current, maximum converter voltage, or similar operating limits.

The operating limits are usually specified in a general manner but need to apply for all conceivable operation conditions to avoid component overheating. Therefore, when operating a power electronic converter using such operating limits, the operating limits may be inefficient and lead to an under-utilization of the actual converter capabilities in at least some operating conditions.

SUMMARY

A method for operating a power electronic converter, the power electronic converter comprising at least one power semiconductor device, the method comprising: estimating at least one semiconductor temperature value, determining at least one current limit for the power electronic converter, controlling the power electronic converter in order to maintain at least one current at or below the current limit, wherein the determination of the at least one current limit comprises carrying out a first operation if the temperature of the at least one semiconductor device is above an upper temperature threshold in order to decrease the current limit, carrying out a second operation if the temperature of the at least one semiconductor device is below a lower temperature threshold in order to increase the current limit; and wherein the first and second operation is respectively based on the actual temperature of the at least one semiconductor device and on at least one previous value of the temperature of the at least one semiconductor device; and wherein estimating the at least one semiconductor temperature value, and determining the at least one current limit, and controlling the power electronic converter are repeated iteratively.

Thus, according to aspects of the invention, a method for operating a power electronic converter is provided, wherein a current limit is increased or decreased in function of the history of temperatures of semiconductors in the power electronic converter, and wherein the operating conditions and history of the converter is taken into account for the adjustment of the current limit. This approach allows to operate the power electronic converter at a much higher current rating if the operating conditions allow for it. Thereby, a more efficient utilization of the actual converter capabilities can be achieved.

BRIEF DESCRIPTION OF D WINGS

Figure 2:
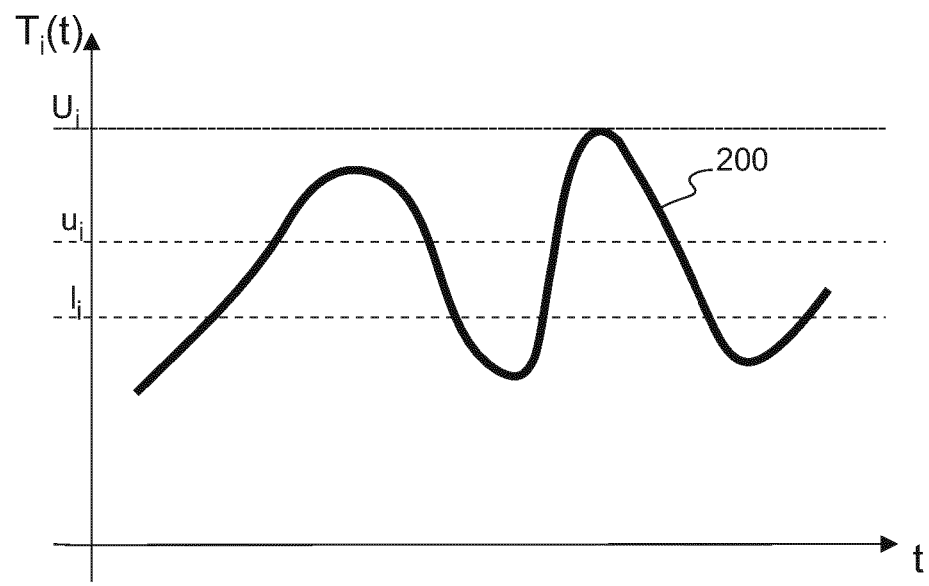

FIG. 1 illustrates a flowchart that summarizes methods for operating a power electronic converter according to some embodiments of the present disclosure FIG. 2 shows a graph of a function with domain formed by time instants and codomain formed by temperatures, the function associating to each time instant the temperature of a semiconductor device at the time instant.

Figure 3:
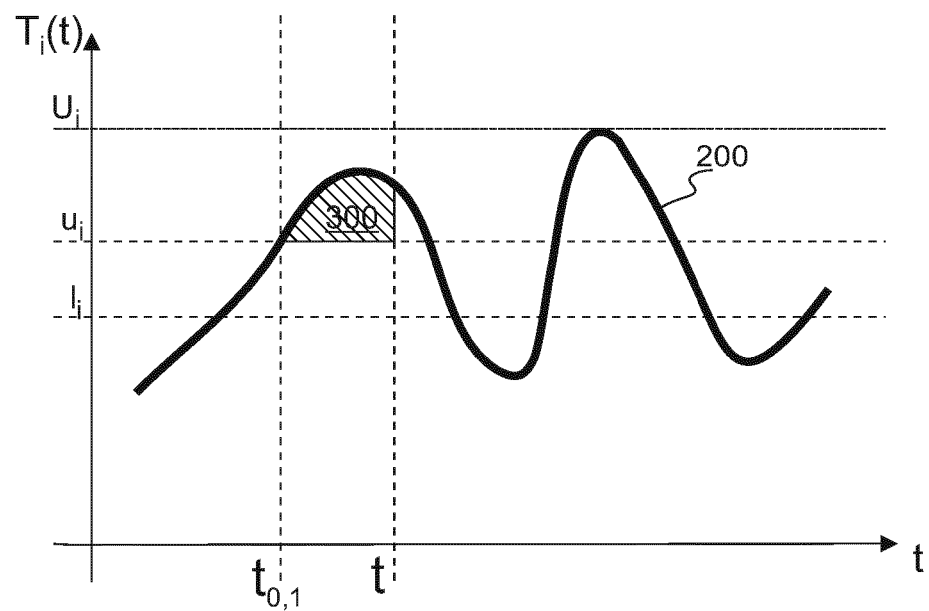
Figure 4:
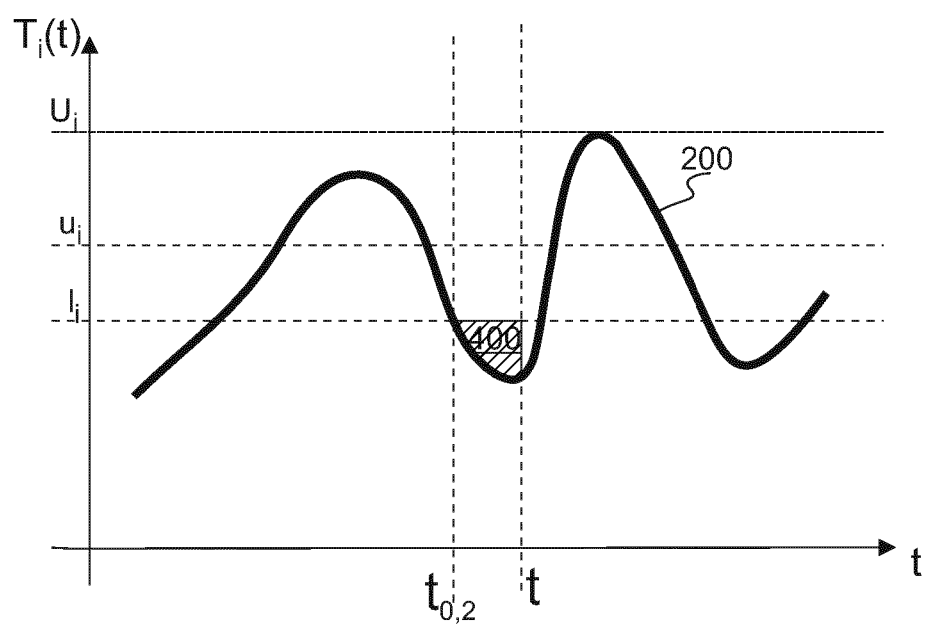
Figure 5:
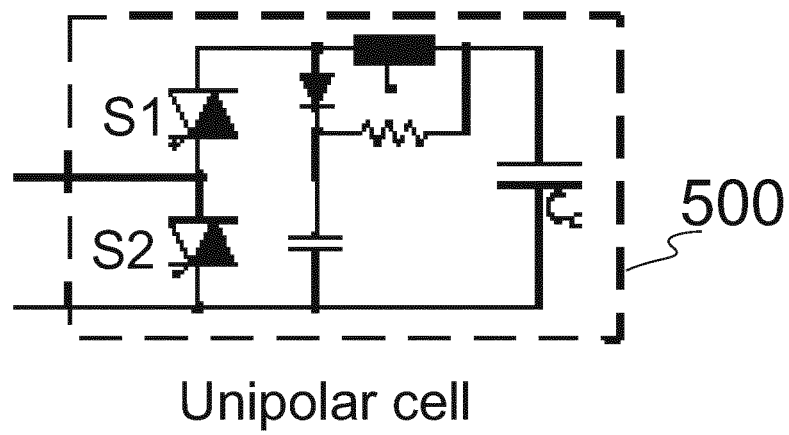
Figure 6:
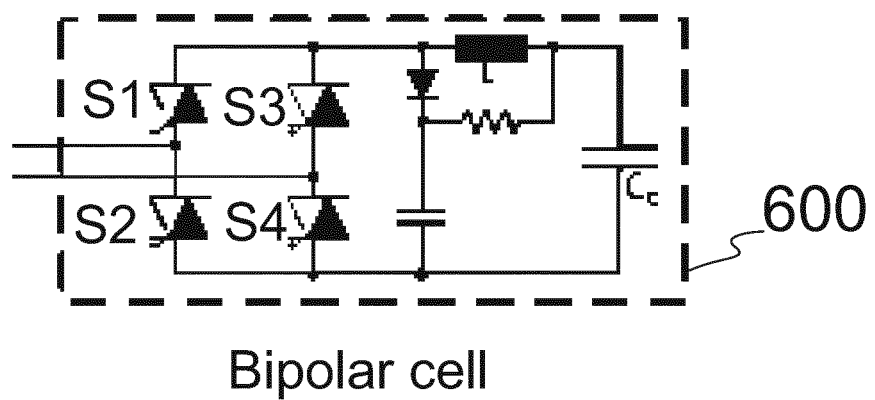
Figure 7:
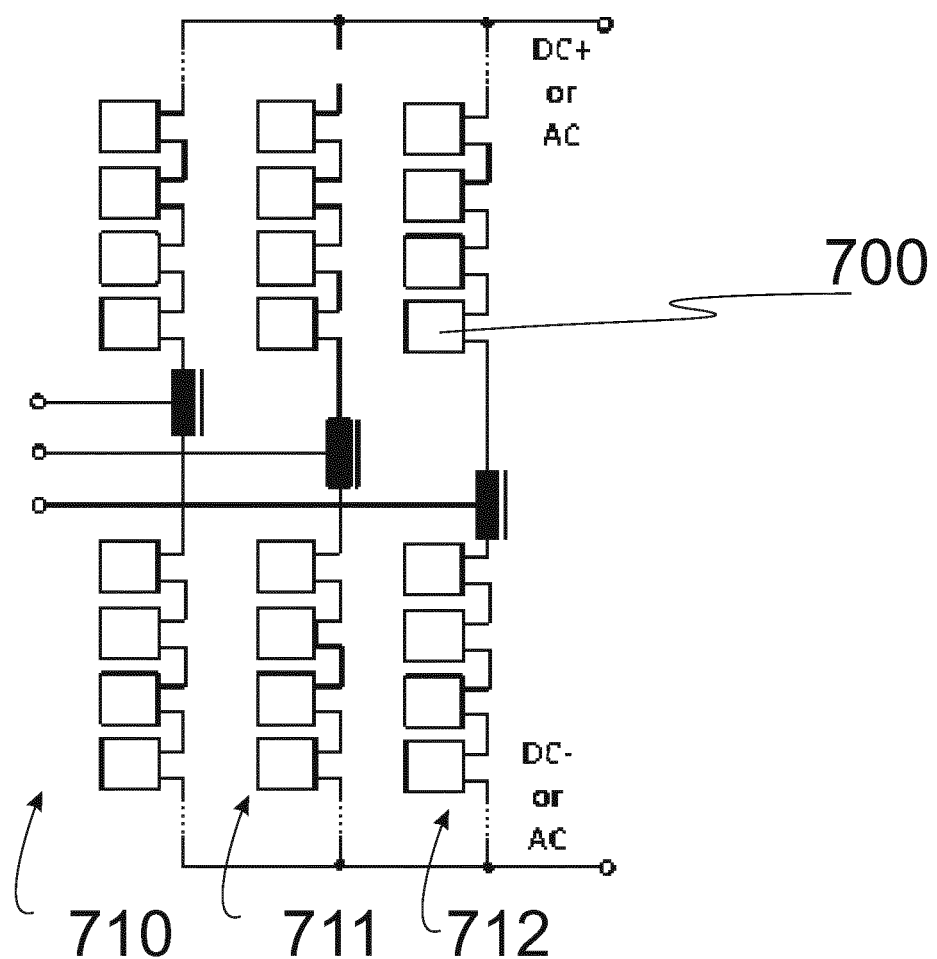

FIG. 3 illustrates a detail related to a first operation carried out in a method for operating a power electronic converter according to some embodiment of the present disclosure FIG. 4 illustrates a detail related to a second operation carried out in a method for operating a power electronic converter according to some embodiment of the present disclosure FIG. 5 shows a unipolar cell 500 containing semiconductor devices FIG. 6 shows a bipolar cell 600 containing semiconductor devices FIG. 7 shows a 3-phase to 1-phase modular multi-level converter (MMC)

Figure 8:
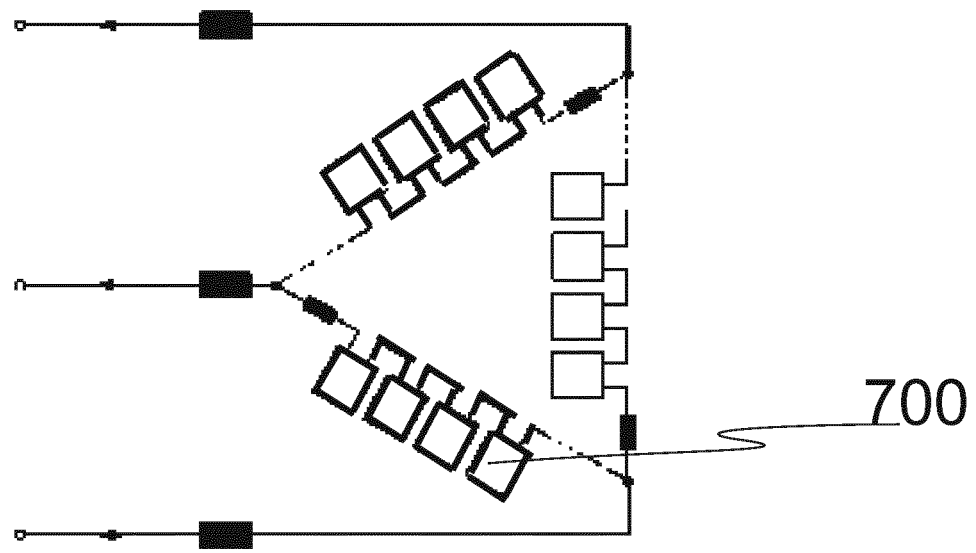

FIG. 8 shows a static synchronous compensator (STAT-COM) modular multi-level converter (MMC)

DETAILED DESCRIPTION OF EMBODIMENTS

During the operation of a power electronic converter, currents flowing in the converter, and in particular currents flowing in the semiconductor devices forming the semiconductor switches, may produce an increase of the temperature inside the power electronic converter and in particular in the semiconductor devices. A rising temperature of a semiconductor device, and in particular of a junction of the semiconductor device or a current value in the semiconductor device exceeding a value of safe operation of the semiconductor device, may permanently damage the semiconductor device. In a power electronic converter it is therefore necessary to maintain the temperature of semiconductor devices below a safe value. This goal is achieved by maintaining currents flowing in the power electronic converter below a current limit for a safe operation of the power converter and in order to avoid damages of the converter and in particular damages of its semiconductor devices due to high temperatures or high currents.

During the operation of a power electronic converter, currents in the power electronic converter are typically maintained below a predetermined current limit for avoiding damages, but this predetermined limit may be too conservative in some conditions, e.g., when the temperatures in the power converter are low. When operated at low temperatures, semiconductor devices in the power converter may be operated with higher currents than the predetermined limit. Moreover a power electronic converter may tolerate a current higher than the predetermined limit under given operating conditions without any damages, e.g. when a short pulse with high power is demanded.

Therefore, in aspects of the present invention, a flexible current limit is proposed that may allow such short pulses under appropriate conditions. The current limit depends on the current temperature as well as the history of temperatures of the semiconductor device, and may thereby depend on further operating condition of the converter. As a consequence of this flexible current limit, a higher temperature (and correspondingly a current limit at or resulting in a high temperature) may be tolerated for a short period of time even for temperatures exceeding a safe operation limit, whereas a lower temperature (and a current limit possibly resulting in a temperature increase, at the lower temperature) may be tolerated for a longer period of time.

Embodiments of the present disclosure are related to methods for operating a power electronic converter, the power electronic converter including at least one power semiconductor device.

In embodiments of the present disclosure, detailed models, e.g. physical models and/or mathematical models, for modeling losses, temperatures and heath flow are used to estimate the actual temperature of many components of the power electronic converter considering a large number of parameters and conditions. Said models are deployed, e.g., in the converter control system. As an input the models may receive a current flow through the respective component and optionally through other components of the converter; the flow velocity and temperature of a cooling medium, and/or other parameters relevant for the temperature. As an output, they deliver an estimated temperature of the respective component. From the present and past estimated temperature(s), the converter control system may then determine a decrease of a current limit or a current reduction request in case the supervised components temperature/temperatures gets close to a maximum allowed value for the respective component. The power electronic converter can therefore be operated at much higher currents than the currents nominally specified by a vendor, e.g. in the presence of low cooling water inlet, pulsing converter load with long cooling phases between pulses, etc.

Definition of Symbols

In the following, the operation of a power electronic converter according to an aspect of the invention is described in more detail. Therein, the following notation is used:

The power electronic converter includes n power semiconductor devices $S_1, \ldots, S_n$, with n at least one.

$T_i(t)$ indicates a temperature related to the power electronic converter, in particular to semiconductor $S_i$, at time instant t. In some embodiments $T_i$ can be an estimated temperature, estimated e.g. with physical models, possibly based on measured data. In some embodiments $T_i$ is identified as the junction temperature $T_{J,i}$ of semiconductor device $S_i$. But, in other embodiments, $T_i$ can also be a temperature of a larger portion of the power electronic converter, or of the converter as a whole. For example, $T_i$ may be a maximum value $T_{max} = \max\{T_{J,1}, \ldots, T_{J,n}\}$ of the values of the junction temperatures of the semiconductors $1, \ldots, n$ in the converter. In other embodiments $T_i$ may be a maximum temperature of the temperatures of the junctions of a set of semiconductors in the converter, the set containing $S_i$. E.g. $T_i$ may e.g. be the maximum temperature $T_{max,\phi}$ of the junctions of all semiconductors operating in the leg for phase $\phi$ in a 3-phase or polyphase converter, with $S_i$ being one of the semiconductors operating in the leg for phase $\phi$.

In some embodiments $T_i$ may be a time averaged value and in particular a moving average of the previously described quantities. In some embodiments $T_i$ may include several temperatures, e.g., as a vector. For example, $T_i$ may contain an instantaneous value of the described quantities and at least an averaged value of said quantities, in particular at least a moving average over time of said quantities.

In some embodiments the at least one semiconductor temperature value $T_i$ may be a function of a vector with components given by instantaneous values and/or time averaged values and/or maximums thereof.

In some embodiments $T_i$ may be given a vector $$(\max\{T_{J,1}, \ldots, T_{J,n}\}, \max\{MA_1(T_{J,1}), \ldots, MA_1(T_{J,n})\}, \ldots)$$

the vector including a maximum of the instantaneous values of the semiconductor junction temperatures in the power electronic converter and at least a maximum of a first moving averages $MA_1$ of the semiconductor junction temperatures. The vector may further include additional moving averages. In some embodiments the moving averages and in particular $MA_1$ may be simple moving averages or exponential moving averages with different sample windows. In some embodiment the moving averages may further be weighted.

In some embodiments a similar vector is considered as above, but including only junction temperatures of semiconductors for a phase in a 3-phase or polyphase system.

In embodiments of the present invention $L_i$ is a current limit for semiconductor device $S_i$. For example, each semiconductor device $S_i$ may be assigned an individual current limit $L_i$.

In some embodiments the limit $L_i$ may be a common current limit for (all) semiconductors in a set of semiconductors that includes $S_i$, such that all currents in all semiconductors in the set are controlled to be below $L_i$, e.g. all currents in all semiconductors in a leg of a 3-phase converter, wherein $S_i$ is a semiconductor in said leg.

In some embodiments, there may be a plurality of limits $L_i$, each for one of a plurality of sets of seminconductor(s) in the converter or even in each phase of the converter. Alternatively, the limit $L_i$ may be identical for all semiconductors in the converter or in each phase of the converter, such that $L_i$ is a global limit for all currents in all semiconductors of the converter or of a given phase of the converter.

The temperature Ti can be a single temperature or a set of temperatures, e.g., one for each i=1, . . . , n.

In embodiments of the present invention $I_i$ is a current flowing through $S_i$ and/or the current limited by application of the current limit $L_i$.

Flowchart of Method for Operating a Converter

FIG. 1 shows a flowchart that summarizes methods for operating a power electronic converter according to various embodiments of the present disclosure.

According to some embodiments, the execution starts in block 110 where a (semiconductor) temperature $T_i$ is estimated, the temperature $T_i$ being, e.g., at least one of the temperatures described previously.

In block 120 it is evaluated, if the at least one temperature $T_i$ is above an upper threshold $u_i$. It is intended that in the embodiments wherein $T_i$ is a vector, $u_i$ may be a scalar or also a vector, and a suitable comparison is carried out, e.g., a comparison between vectors evaluating a predicate dependent on $T_i$ and $u_i$. The comparison may, e.g., be elementwise. Alternatively, the comparison may evaluate to true if any component of $T_i$ is above the corresponding component of $u_i$. In some embodiments a difference $T_i-u_i$ is determined and evaluated according to any convenient metric or norm or transformation, in order to evaluate if $T_i$ is above $u_i$.

If the condition in block 120 evaluates to true, block 140 is executed wherein a limit $L_i$ for the current $I_i$ is determined (e.g., computed or updated), as described in more detail further below. Herein, the determining of the current current limit $L_i$ includes carrying out a first operation (limit-decreasing operation) in order to decrease the current limit (e.g., resulting in the current limit being lower than directly before, subject to additional conditions such as an absolute lower floor value of the current limit). The limit-decreasing operation is based on the actual temperature of the at least one semiconductor device and on at least one previous value of the temperature of the at least one semiconductor device.

After block 140, the execution proceeds with block 110.

If the condition in block 120 evaluates to false, then block 130 is executed. Alternatively, the blocks 120 and 130 can also be executed in reverse order, or within a single block.

In block 130 it is evaluated, if the at least one temperature $T_i$ is below a lower threshold $l_i$. Therein, the above remarks regarding block 120 apply analogously. For example, if $T_i$ is a vector, $l_i$ may also be a vector, and the condition may evaluate to true if all components of $T_i$ are below the corresponding component of $l_i$.

If the condition in block 130 evaluates to true, block 150 is executed wherein a limit $L_i$ is determined (e.g., computed or updated), as described in more detail further below. Herein, the determining of the current current limit $L_i$ includes carrying out a second operation (limit-increasing operation) in order to increase the current limit (e.g., resulting in the current limit being higher than directly before, subject to additional conditions such as an absolute upper ceiling value of the current limit). The limit-increasing operation is also based on the actual temperature of the at least one semiconductor device and on at least one previous value of the temperature of the at least one semiconductor device.

The new or updated value for $L_i$ is then used to control the power electronic converter in order to maintain at least one current at or below the limit $L_i$.

After block 150, the execution can proceed with block 110, so that a loop is created. In some embodiments the execution iteratively proceeds in a loop, as shown in FIG. 1.

In some other embodiments the loop may instead be implemented with some physical device, such that the different blocks may relate to different subsystems of the device and not necessarily represent an order in time. E.g. an analog integrator may be used to continuously compute integrals based on historical values on which the update of the current current limit may be based. In yet other embodiments said integrator may be replaced or approximated by a digital computer or controller where one or more computer or controllers may operate in parallel.

Generally $l_i \le u_i$. In some embodiments the lower temperature threshold $l_i$ is (truly) lower than $u_i$. In other embodiments the lower temperature threshold $l_i$ may be equal to the upper temperature threshold $u_i$. In some embodiments the lower or upper temperature threshold is constant over time. In some embodiments the lower or upper temperature threshold may be adjusted over time, e.g. updating said threshold when more refined models e.g. of semiconductor devices are considered or become available or in function of variable operating conditions of the converter.

Thereby, embodiments of the present disclosure allow for operating the power electronic converter in order to prevent or reduce damage due to high temperatures to at least one semiconductor device in the power electronic converter.

Further aspects of the method include: estimating a temperature $T_i$ related to $S_i$ at time instant t, determining at least one current limit $L_i$ for the power electronic converter, and controlling the power electronic converter in order to maintain at least one current $I_i$ at or below the current limit $L_i$.

The steps illustrated in FIG. 1 may be varied. For example, the logical order of steps 120 and 130 can be reversed, or both steps may be evaluated in a single step, e.g., a step of determining, for a plurality of ranges (e.g., above upper threshold $u_i$, below lower threshold $l_i$, or between both thresholds), to which of these ranges the value of $T_i$ belongs.

In some embodiments of the present disclosure, methods for operating a power electronic converter according to FIG. 1 are repeated iteratively. It is intended that in methods for operating a power electronic converter according to the present disclosure, estimating the at least one semiconductor temperature value, and determining the at least one current limit, and controlling the power electronic converter are repeated iteratively. The execution according to FIG. 1 may iteratively proceed in a loop wherein e.g. the estimation of $T_i$ occurs repeatedly. In some embodiments the repeated iteration may be carried out as a sequence of discrete steps, whereas in some other embodiments the repeated iteration may at least partially be include operation performed continuously over time, such that in those embodiments e.g. a temperature $T_i$ may be estimated at any time instant over at least an interval of time instants and be read out at discrete time steps. In still other embodiments, a parallel execution of various tasks may be present, with an effect substantially equivalent to an iterative repetition of the flow summarized in FIG. 1. In still other embodiments, methods of the present disclosure may be implemented with analog devices, e.g. with an analog integrator, that continuously provide outputs over time that may e.g. be read out with the use of switches operated e.g. with the use of analog circuits and/or in the presence of analog sensors and analog circuits. Therefore digital, analog or mixed signal implementations may be considered in order to carry out methods described in the present disclosure. It is intended that all those embodiments operate in order to implement the flow of FIG. 1 repeated iteratively or to obtain an implementation that is substantially equivalent, e.g. when considering analog or mixed signal implementations, to a repeated iterative operation according to the flowchart shown in FIG. 1. In some embodiments of the present disclosure, estimating the at least one semiconductor temperature value, and determining the at least one current limit, and controlling the power electronic converter, are repeated iteratively within a loop and with a frequency that is above or equal to a minimum frequency in order to effectively control the temperature of the at least one power semiconductor device in the power electronic converter.

Said minimum frequency may depend on the value of physical quantities characterizing the power electronic converters or semiconductors in the power electronic converter as well as on switching commands given to semiconductors of the power electronic converter. The minimum frequency may depend e.g. on time constants characterizing the heat propagation and/or dissipation within the power electronic converter or within semiconductors of the power electronic converter and on the frequency of switching commands. The minimum frequency of operation, corresponds to a minimum frequency at which the flow described in FIG. 1 must be executed in order to effectively control the temperature of the at least one power semiconductor in the converter.

It is intended that a controller is configured in order to maintain at least one current at or below the current limit $L_i$ that is computed or updated according to embodiments of the present invention and according to the flow shown in FIG. 1.

Estimation of the Temperature

In some embodiments the estimation of $T_i$ includes the use of physical models of the converter or of semiconductors in the converter. In some embodiments the estimation may include a measurement, in particular a measurement of temperatures inside the power converter.

Most components of power electronic converters are subject to power losses occurring in operation. Those power losses depend on various operating conditions of the power converter, such as operating current, operating voltage, semiconductor switching frequency or duty cycle, etc. The power losses of the different components may lead to an increase of the operating temperature of either the entire component or some parts of the inner structure thereof. Dedicated cooling systems are installed inside the power electronic converter to ensure that each component is operated within its specified temperature range. The temperature that each component reaches in a steady state operating condition depends on the exact electric operating conditions of the power converter as well as on numerous parameters of the installed cooling systems, e.g. cooling water temperature. The cooling system must be able to remove the required amount of heat in order to keep the temperature of every component within its specified or allowable limits.

The vendor of the power electronic converter is typically specifying nominal limits regarding the operation of the power converter, such as nominal maximum converter currents, maximum converter voltages, etc, based e.g. on limits specified by the vendors of the semiconductor devices used in the converter. Due to the large number of parameters that significantly influence the generated losses as well as the cooling capacity or because of a large variability or sensitivity in function of said parameters, the nominal current limits may be a conservative limit or a minimum limit or a limit well below an otherwise allowable current limit under a given actual operating condition. Therefore, the consideration of only a nominal current limit leads to a bad utilization of the converter.

In the present disclosure, physical or mathematical models are considered in order to estimate the semiconductor losses and temperatures in real-time considering all relevant operating conditions, e.g. converter currents, converter voltages, semiconductor switching commands, cooling water flow inlet, cooling water temperature, cooling water pressure, cooling water glycol content. Based on said quantities temperatures of the semiconductor devices of the power electronic converter can be estimated. In some embodiments a maximum temperature across all semiconductors of the entire power electronic converter is estimated.

In some embodiments the estimate is based on physical models of the converter or of semiconductors in the converter and/or on measurements, e.g. with the use of a thermal circuit wherein the temperature of a junction of a semiconductor device is estimated e.g. based on power dissipated in the device, on estimated or measured ambient temperature or on the temperature of a cooling fluid, e.g. water or water with glycol, and/or on temperatures of components of the converter like heat sinks and based on thermal resistances between parts of the converter or between parts of the converter and the ambient or cooling water. Further, in some embodiments, the models may include thermal capacitances.

In some embodiments the models may be based on advanced simulations of the heat flow inside the converter based on the dissipated power.

Semiconductors devices in the power electronic converter may be IGCTs or IGBTs or any other type of semiconductor device suitable in particular for switching functions in a power converter.

The type of semiconductors used defines the exact structure and parameters of the loss and thermal models considered in the present disclosure. In some embodiments, a reverse conducting IGCT which consists of a forward conducting gate commutated thyristor and a reverse conducting diode was considered. Each semiconductor device has its own individual model. In some embodiments different semiconductor devices may share the same heatsink and therefore the thermal models for e.g. different thyristors and/or diods are coupled. The semiconductor temperatures may show a large ripple of e.g. 5 to 10 Kelvin depending in particular on the operating conditions of the power electronic converter. Depending on the operating point a peak temperature or an average temperature may form a limiting factor and therefore in some embodiments of the present disclosure an instantaneous or a time averaged temperature or a vector of instantaneous and average temperatures is used.

In some embodiments of the present disclosure, a maximum instantaneous value of semiconductor temperatures across all semiconductors and a maximum average value of semiconductor temperatures across all semiconductors is estimated. Maximum values of temperature or average temperature may in particular be computed for semiconductor devices in a cell and then the maximum values for different cells and/or for different legs are compared in order to obtain maximum values of temperatures for all legs or for the entire converter.

Determining a Current Limit

FIG. 2 shows a graph 200 of a function $T_i$ representing the estimated temperature as a function of time, i.e., with domain formed by time instants and codomain formed by the estimated temperature $T_i$.

In some embodiments of the present disclosure the determination of the at least one current limit $L_i$ includes: carrying out a first operation if the temperature $T_i$ related to the semiconductor $S_i$ is above an upper temperature threshold $u_i$ in order to decrease the current limit $L_i$, carrying out a second operation if the temperature of the at least one semiconductor device $S_i$ is below a lower temperature threshold $l_i$ in order to increase the current limit $L_i$. The first and second operation is respectively based on the estimated actual temperature $T_i$ related to the at least one semiconductor device $S_i$ and on at least one previous value of the temperature related to the at least one semiconductor device $S_i$. Thus for an actual time instant t, the first and second operation is based on $T_i(t)$ and on $T_i(\tau)$ with $\tau \leq t$. Herein, "based on" is to be understood as using these two temperatures $T_i(t)$ and on $T_i(\tau)$, or a value derived therefrom, as an input. This does not exclude further inputs such as a further previous value of the temperature taken at another time different from $\tau$.

For the implementation of the first operation, in some embodiments a value $H_{i,1}$ is computed that may in particular depend on one or more historical values of the temperature $T_i$. A function $\Theta_1$ then produces a value for a current limit $L_i$ in the converter in particular based on $H_{i,1}$. In some other embodiments the function $\Theta_1$ depends on a history of temperature values, e.g. on a discrete sequence. In some embodiments, the function $\Theta_1$ may then directly output a new value for $L_i$ or an increment or decrement for $L_i$ or may identify a differential increment according to which $L_i$ is forced to vary.

For the implementation of the second operation, in some embodiments a value $H_{i,2}$ is computed that may in particular depend on one or more historical values of the temperature $T_i$. A function $\Theta_2$ then produces a value for a current limit $L_i$ in the converter in particular based on $H_{i,2}$. In some other embodiments the function $\Theta_2$ depends on a history of temperature values, e.g. on a discrete sequence. In some embodiments, the function $\Theta_2$ may directly output a new value for $L_i$ or an increment or decrement for $L_i$ or may identify a differential increment according to which $L_i$ is forced to vary.

In some embodiments, whenever the temperature approaches a maximum allowed temperature specified by a semiconductor vendor for a semiconductor device in the power electronic converter, the power converter current limit or a power converter current setpoint is limited to a certain value, e.g. the value of the decreased limit $L_i$.

In some embodiments, whenever the temperature is well below the maximum allowable temperature specified by a semiconductor vendor, the power converter current limit or a power converter current setpoint limitation mentioned above is gradually released, e.g. gradually increasing the limit $L_i$.

In some embodiments, the power electronic converter is thus capable of an operation close to the physical limits of the semiconductors in the converter irrespective of prevailing operating conditions, may they be particularly favorable or particularly unfavorable, e.g. in function of the load, the power transferred, the temperature of the cooling water etc.

In some embodiments the current limit $L_i$ is configured to limit the maximum semiconductor temperatures to predefined values by requesting a converter RMS current reduction in order to limit the instantaneous as well as the average maximum semiconductor temperatures.

As shown in FIG. 3 and FIG. 4 the first or the second operation may comprise and integration, for computing an area 300 or 400, as will be described in detail subsequently. The limit $L_i$ may be based on the area 300 or 400 and thus be dependent on past values $T_i(\tau)$ with $\tau \leq t$.

In some embodiments each estimated temperature, i.e. instantaneous and average maximum temperatures, is compared to an upper and a lower level. If a temperature value is outside the interval defined by the lower and upper levels, the over/under-shoot is integrated. In some embodiments the interval identified by the lower and upper levels forms a band of no action. Temperatures exceeding the upper level require a current limit reduction or a current set point decrease, whereas temperature values below the lower level allow a current limit increase or a current set point increase for currents in the electronic power converter.

In some embodiments the limitation must act fast to avoid over temperatures, increasing the current reference after a limitation period is done slowly to avoid disturbances/instability of the control. In some embodiments the integration may further include a weighting of temperatures. In some embodiments the integration is carried out by an integrator and the output of the integrator is limited to the range from zero up to the maximum converter RMS current, whereas the maximum converter RMS current is a semiconductor dependent value.

In some embodiments, when decreasing the current limit, the decrease is at least sometimes a strict decrease.

In some embodiments, when increasing the current limit, the increase is at least sometimes a strict increase.

With reference to FIG. 2, when the temperature $T_i(t)$ related to the semiconductor device $S_i$ in the power electronic converter at time instant t is above the upper threshold $u_i$ a first operation is carried out in order to decrease the current limit $L_i$ at time instant t. When the temperature $T_i(t)$ related to the semiconductor device $S_i$ in the power electronic converter at time instant t is below the lower threshold $l_i$ a second operation is carried out in order to increase the current limit $L_i$ at time instant t. The second operation may have different characteristics compared to the first operation and in particular the increase of the current limit may be carried out slower than the decrease.

For an actual time instant t, in some embodiments of the present disclosure, the first or second operation is based on the actual temperature $T_i(t)$, at the actual time instant t, and on the value $H_i(t)$ of a function $H_i$ at time instant t where the value of $H_i$ at t depends on at least one past value $T_i(\tau)$ of $T_i$ at $\tau$, with $\tau \leq t$. In some embodiments the time instant $\tau$ may strictly precede t, i.e. in some embodiments of the present disclosure $\tau$ is such that $\tau < t$ In some embodiments for the first operation, a first function $H_{i,1}$ is considered and for the second operation, a second function $H_{i,2}$ is considered for said function $H_i$.

In some embodiments the value $H_{i,1}(t)$ of the first function $H_{i,1}$ at t may for example be given by $H_{i,1}(t) = \int_{t_{0,1}}^{t} (T_i(\tau) - u_i) d\tau$ wherein $t_{0,1}$ may e.g. be a last time instant when the estimated temperature $T_i$ was equal to an upper temperature threshold related to the first operation, e.g. to the threshold $u_i$ shown in FIG. 2.

In FIG. 3 the area 300 has a measure given by $H_{i,1}(t)$ according to embodiments of the present disclosure.

In some embodiments the value $H_{i,2}(t)$ of the second function $H_{i,2}$ at t may for example be given by $H_{i,2}(t) = \int_{t_{0,2}}^{t} (l_i - T_i(\tau)) d\tau$ wherein $t_{0,2}$ may e.g. be a last time instant when the estimated temperature was equal to a lower temperature threshold related to the second operation, e.g. to the threshold 1, shown in FIG. 2.

In FIG. 4 the area 400 has a measure given by $H_{i,2}(t)$ according to embodiments of the present disclosure.

In some embodiments the functions $H_{i,j}$ for j=1, 2 may include further transformations, e.g. $H_{i,j}(t) = \int_{t_{0,j}}^{t} W_j(T_i(\tau), l_i, u_i) d\tau$, wherein e.g. temperatures $T_i$ may be transformed according to a transformation $W_j$ that may differently weight different temperatures.

In some embodiments of the present disclosure the transformations $W_1$ may be different from the transformation $W_2$ for differently weighting a temperature exceeding an upper threshold $u_i$ from a temperature being below a lower threshold $l_i$.

In embodiments wherein $T_i$ is a vector, the integrals are intended to be operators on vectors, and also $W_j$ forms an operator on vectors that may be linear or nonlinear.

In some embodiments a current limit is based on $H_{i,j}$ or otherwise on a sequence of historical values of temperatures. In some embodiments a current limit is based on $H_{i,j}$ and on further transformation that may include e.g. a limitation below a maximum RMS converter current, whereas the maximum converter RMS current is a semiconductor dependent value.

It is intended that the first operation is based on $H_{i,j}$ and the second operation is based on $H_{i,2}$.

In some embodiments a further transformation of $H_{i,1}$ may be indicated with $\Theta_1$ and a further transformation of $H_{i,2}$ may be indicated with $\Theta_2$. Transformations $\Theta_j$ for j=1, 2 may include the limitation of the current limit $L_i$ below an absolute maximum bound, e.g. a maximum converter RMS current dependent on parameters of semiconductor devices of the converter.

In some embodiments the integration output value indicates the value by which the current limit $L_i$ or a current controller set point must be decreased to avoid an over temperature of the semiconductor devices. The decrease cannot bring $L_i$ below zero.

In some embodiments, in case the current set point reduction cannot avoid a further increase of a semiconductor instantaneous and/or average temperature, the power electronic converter is stopped with a forced stop to avoid semiconductor damage. In some embodiments, the forces stop may correspond to a decrease of $L_i$ to zero.

Various alternative embodiments are described in the following in more detail.

Possible Details and Alternative Features of Embodiments

Next, some further possible variations and details according to possible aspects of the invention are described. These aspects can be combined with any other aspect or embodiment described herein, unless such a combination is explicitly excluded.

In some embodiments the decrease of the at least one current limit $L_i$ as a result of the first operation may be directly or inversely proportional to $H_{i,1}$.

In some other embodiments the at least one current limit decrease as a result of the first operation may be further dependent on $H_{i,1}$ in function of a linear or nonlinear transformation $L_i = \Theta_1(H_{i,1}, T_i, \Pi)$ with $\Pi$ a set of parameters or state variables of the at least one semiconductor device or the power electronic converter, e.g. including estimated or measured temperatures or currents and voltages in the converter or switching commands of the converter. The function $\Theta_1$ may be in particular configured to limit the current limit $L_i$ below an absolute upper bound and above an absolute lower bound, e.g. zero.

In some embodiments the increase of the at least one current limit $L_i$ as a result of the second operation may be directly or inversely proportional to $H_{i,2}$.

In some embodiments the at least one current limit increase as a result of the second operation may be further dependent on $H_{i,2}$ in function of a linear or nonlinear transformation $L_i = \Theta_2(H_{i,2}, T_i, \Pi)$ with $\Pi$ a set of parameters or state variables of the at least one semiconductor device e.g. including estimated or measured temperatures or currents and voltages in the converter or switching commands of the converter. In some embodiments the nonlinear transformation includes limiting the current value below an absolute maximum limit and above an absolute minimum limit, e.g. zero. The function $\Theta_2$ may be in particular configured to limit the current limit $L_i$ below an absolute upper bound and above an absolute lower bound like, e.g. zero. It is intended that the bounds include equality such that $L_i$ may be equal to the upper or lower bound. In particular $L_i$ may be zero.

It is intended that "below" or "above" should also include equality such that "below" means "below or equal to" and "above" means "above or equal to".

In some other embodiments a function $\Theta_j$ may instead determine a differential current limit variation for a time differential dt given by $dL_{i,j} = \Theta_j(L_i, H_{i,j}, T_i, \Pi) dt$ for j=1, 2 respectively. Accordingly during the first operation $L_i$ is increased varying by $dL_{i,1}$ and during the second operation $L_i$ is decreased varying by $dL_{i,2}$ during a time differential dt.

It is intended that $dL_{i,1}/dt$ forms a derivative over time of $L_i$ when the first operation is carried out and that $dL_{i,2}/dt$ forms a derivative over time of $L_i$ when the second operation is carried out and that the value of said derivatives $dL_{i,j}/dt$ is imposed in dependence of $\Theta_j$ for j=1, 2 respectively.

In some embodiments a discrete difference $\Delta L_{i,j}$ is computed instead with $\Delta L_{i,j} = \Theta_j(L_i, H_{i,j}, T_i, \Pi)$ and during the first operation $L_i$ is updated according to $\Delta L_{i,1}$ and during the second operation $L_i$ is updated according to $\Delta L_{i,2}$ respectively. It is intended that $L_i$ forms a sequence of discrete values that are updated according to $\Delta L_{i,1}$ when the first operation is carried out and according to $\Delta L_{i,2}$ when the second operation is carried out.

In some embodiments $\Theta_j$ may further depend on one or more previous values of the at least one semiconductor temperature. In some embodiments $\Theta_j$ may further depend on one or more previous values of $L_i$. In some embodiments $\Theta_j$ may depend on a sequence of past values of the at least one semiconductor temperature $T_i$. In some embodiments $\Theta_j$ may depend on a sequence of past values of the current limit $L_i$.

In some embodiments $\Theta_j$ or $H_{i,j}$ may be approximated using numerical methods, e.g. on a microcontroller or computer. In other embodiments other implementations may be used, e.g. based on an analog controller or on an analog circuit, e.g. an analog integrator.

It is intended that a dependency of an output quantity in function of an input quantity may also be present, if the output quantity remains constant when the input quantity is varied.

In some embodiments $L_i$ may be computed directly without first computing a discrete difference or a differential, using alternative computations carried out e.g. on a digital computer or microcontroller that may e.g. receive as input a sequence of past values of the temperature of the at least one power semiconductor device.

In some other embodiments $L_i$ may be computed on a digital, analog or mixed-signal device.

In some embodiments $\Theta_j$ may further depend on a sequence of past values of $T_i$ or of $T_{max}$ or of $T_{max,\phi}$ for a phase $\phi$, as previously defined In some embodiments $\Theta_j$ may further ensure the limitation of $L_i$ below a maximum value. Said maximum value may be zero, corresponding to a shutdown of the converter for cooling.

In some embodiments $\Theta_j$ may include any operation that is beneficial in order to decrease or increase a current limit for the power electronic converter in particular ensuring that, taking into account the specific converter and the specific semiconductor devices, a damage does not occur even when operating the power electronic converter at higher than nominal currents.

In some embodiments the at least one semiconductor temperature value is obtained by estimation based on models and in particular on physical models of the power semiconductor device or the converter. In some embodiments the at least one semiconductor temperature value is obtained by measurement. In some embodiments the at least one semiconductor value is obtained by a combination of at least one measurement and an estimation based on physical models receiving as input the measured data.

For an actual time instant t, in some embodiments of the present disclosure, the first and second operation are based on the actual estimated temperature $T_i(t)$ of the at least one power semiconductor device $S_i$ and on a discrete sequence of past values of the estimated temperature of the at least one power semiconductor device $S_i$ in the power electronic converter.

In some embodiments the first or second operation may further include additional linear or nonlinear transformations, e.g. multiplication with constants. The transformation may further return transformed values dependent on the evaluation of Boolean conditions, e.g. dependent on the comparison with absolute maximum values for the temperature or the currents in the power electronic converter. In some embodiments the first or second operation may further include a limitation of the current limit $L_i$ below an absolute maximum or above an absolute minimum. In some embodiments the absolute minimum is zero. In some embodiments the current limit $L_i$ may be significantly reduced or set to zero whenever a given condition evaluates to true, e.g. whenever an absolute maximum value for the estimated temperature is approached or reached or exceeded. In some embodiments the first or second operation may further depend on one or more previous value of the current limit $L_i$.

In some embodiments of the present disclosure, a current limit $L_i$ is determined for each semiconductor device $S_i$, with i=1, ..., n, with n the number of semiconductor devices in the power electronic converter. In some embodiments a current limit $L_{min} = \min\{L_1, \ldots L_n\}$ is determined and the power electronic converter is controlled in order to maintain all currents flowing in semiconductor devices of the converter below the current limit $L_{min}$, i.e. the power electronic converter is controlled such that no semiconductor current exceeds $L_{min}$.

In some further embodiments a current limit $L_i$ is determined for each semiconductor device $S_i$, with i=1, ..., n, with n the number of semiconductor devices in the power electronic converter and the set $\{S_1, \ldots S_n\}$ may further be partitioned considering a partition $\{\Sigma_1, \ldots, \Sigma_k\}$ of the set $\{S_1, \ldots S_n\}$ with k blocks $\Sigma_1, \ldots, \Sigma_k$, with k a natural number and k different from zero. Each block $\Sigma_x \in \{\Sigma_1, \ldots \Sigma_k\}$ forms a subset of the set $\{S_1, \ldots S_n\}$ and $$\bigcup_{x=1}^{k} \Sigma_x = \{S_1, \ldots S_n\}$$

i.e. the union of all blocks in the partition is equal to $\{S_1, \ldots S_n\}$. Further the intersection of different blocks in the partition is empty, i.e. $\Sigma_x \cap \Sigma_z = \emptyset$ if x is not equal to z. In some embodiments a current limit $L_\Sigma$ is computed for each block $\Sigma_x$ in the partition $\{\Sigma_1, \ldots \Sigma_k\}$ as $$L_{\Sigma_x} = \min\{L(S_\chi) | S_\chi \in \Sigma_x\}$$

wherein $L(S_\chi)$ is the current limit for the device $S_\chi$, i.e. $L(S_\chi) = L_\chi$, for $\chi=1, \ldots n$. In some embodiments the power electronic converter is controlled such that for each semiconductor device $S_i$ of the power electronic converter, with i=1, ..., n, the current flowing through $S_i$ is at or below the limit $L_{\Sigma(S_i)}$ where $\Sigma(S_i)$ indicates the unique block of the partition $\{\Sigma_1, \ldots \Sigma_k\}$ that contains the device $S_i$. In some embodiments the partition $\{\Sigma_1, \ldots \Sigma_k\}$ contains exactly three blocks $\{\Sigma_1, \ldots \Sigma_3\}$ wherein each block contains all semiconductor devices for a related phase of a 3-phase converter, i.e. $\Sigma_1$ contains all semiconductor devices for phase 1, $\Sigma_2$ contains all semiconductor devices for phase 2 and $\Sigma_3$ contains all semiconductor devices for phase 3 of a 3-phase converter. In some embodiments each block of a partition $\{\Sigma_1, \ldots \Sigma_k\}$ with k blocks of the set $\{S_1, \ldots S_n\}$ contains all semiconductors related to a phase of a k-phase converter.

In some embodiments, the method for operating a power electronic converter includes the storage of at least one past value $T_i(\tau)$ of the at least one semiconductor temperature value of a semiconductor $S_i$ in the converter and the determination of the at least one current limit $L_i$ is further based on the stored at least one past value. In particular the at least one current limit $L_i$ at time t is computed based on the at least one past value $T_i(T)$ with $\tau < \tau$ or, in some embodiments with $\tau \le t$.

In some embodiments the storage of at least one past value $T_i(\tau)$ of the at least one semiconductor temperature value is carried out storing the at least one past value digitally on a memory of a microcontroller or a computer. In some embodiments the microcontroller or the computer is further used to carry out the first operation to decrease the current limit $L_i$ or the second operation to increase the current limit $L_i$.

In some embodiments the function $H_{i,j}$ is computed approximately or exactly with the use of a digital microcontroller or computer. In some embodiments the computation on a digital microcontroller or computer includes reading the stored at least one past value of the at least one semiconductor temperature value or reading a sequence of past values of the at least one semiconductor temperature stored in the memory of the microcontroller or computer. The computer or microcontroller can be any computer system, in particular also a distributed computing system or a system where data is exchanged over a network The memory of the computer or microcontroller can be any memory suitable for the storage of digital data, including memory accessible over bus systems or network connections.

In some embodiments the determination of the at least one current limit $L_i$ is iteratively repeated within a loop.

Said loop may correspond to a loop, e.g. a while loop, executed by a microcontroller or a computer. In particular said loop may be executed repeatedly within a time interval in order to obtain the at least one current limit $L_i$ in real time or near real time in order to effectively control the power electronic converter.

In some embodiments the second operation includes an increase of the at least one current limit $L_i$ at least if the actual at least one current limit $L_i$, i.e. the value of $L_i$ at an actual time instant t, is below an absolute upper bound $U_i$ and $L_i$ is not increased otherwise In some embodiments the at least one current limit $L_i$ may be increased at least above a nominal value when the second operation is carried out when the temperature of the at least one semiconductor device is below a lower temperature. In some embodiments the increase may be at least sometimes a strict increase In some embodiments the second operation includes an increase of the at least one current limit at least if the actual at least one current limit is below an absolute upper bound. In some embodiments the at least one current limit is increased at least above a nominal value.

In some embodiments the first operation includes a decrease of the actual at least one current limit at least if the actual at least one current limit is above an absolute lower bound such as zero. In some embodiments the at least one current limit is decreases at least below a nominal value when the first operation is carried out when the temperature of the at least one semiconductor device is above an upper temperature threshold. In some embodiments the decrease may be at least sometimes a strict decrease. In some embodiments the at least one current limit is a current limit for at least one phase current in a polyphase power electronic converter.

In some embodiments the at least one current limit is a RMS current limit.

In some embodiments, the estimation of the at least one semiconductor temperature $T_i$ includes the use of a physical model of the power semiconductor device and of the converter, the physical model being represented by a function having as an input a set of relevant operating conditions and/or states of the converter and having as an output a temperature $T_i$ of the at least one power semiconductor device $S_i$, wherein the relevant operating conditions or states includes one or more of: currents flowing in the converter/power semiconductor device, voltages in the converter/power semiconductor device and in particular across semiconductor terminals, semiconductor switching commands, the temperature of a cooling liquid or fluid, the flow of cooling liquid or fluid, the pressure of cooling liquid or fluid, the glycol content of the cooling liquid, the ambient temperature, measured temperatures in the converter.

In particular the use of a physical model of the power semiconductor device and/or of the converter is beneficial for a more precise estimate of a temperature $T_i$ of a semiconductor device. Including relevant operating conditions, it is possible to estimate a temperature $T_i$ of the converter much faster and in a more accurate way when compared to temperatures obtained e.g. measuring temperatures of parts of the converter or of semiconductor devices and/or considering a simple thermal model. In some embodiments the physical model is further based on quantities that are obtained by measurement, e.g. on measured values of state variables of the physical model. The measurement may e.g. be a temperature measurement, a measurement of current or voltage, of a speed of a cooling fluid or liquid or of some characteristics of the cooling fluid like a glycol content.

In some embodiments a power electronic converter is provided, the power electronic converter being configured for being operated according to methods of the present disclosure.

A power electronic converter being configured for being operated according to methods of the present disclosure may in particular includes a controller configured to control the power electronic converter in order to maintain at least one current at or below a current limit, wherein the current limit is computed according to methods described in the present disclosure implemented e.g. on the controller or on an additional controller or computer, and in particular on a digital controller or digital computer or on a controller including some analog device, like an analog integrator. The inputs to the controller, and in particular the estimated at least one semiconductor temperature, may be provided through sensors or measurement devices and/or by a microcontroller or digital computer or analog computer, configured to implement computations according to physical models of the converter or of the at least one semiconductor device in order to provide the estimated temperature.

FIG. 5 shows a unipolar cell 500 with semiconductor switching devices S1 and S2 that may be present or used in a power electronic converter in particular according to embodiments of the present disclosure. The cell presents two terminals, extending outside of the cell 500. Depending on the state of the semiconductor switching devices in the cell, the terminals of the cell may present a low impedance when S2 conducts and S1 is switched off, thus with the terminals ideally acting like a short circuit, or the terminals may act as a voltage source when S2 is switched off and S1 is conducting, wherein the voltage is provided by a charged capacitor within the cell 500.

FIG. 6 shows a bipolar cell 600 with four semiconductor switching devices S1, S2, S3, S4 that may be present or used in a power electronic converter in particular according to embodiments of the present disclosure.

The cells 500 and 600 further include a diode.

Unipolar or bipolar cells 500, 600 may be used in a power electronic converter.

FIG. 7 shows a 3-phase to 1-phase modular multi-level converter (MMC) including cells 700 that may be unipolar cells 500 or bipolar cells 600. Such a converter may be operated according to methods of the present disclosure or form embodiments of the present disclosure. The converter shown in FIG. 7 is a 3-phase converter with legs 710, 711, 712 for each phase, each leg 710, 711, 712 containing a plurality of cells 700, shown in a vertical alignment in FIG. 7. For each phase leg 710, 711, 712 the cells 700 are switched with alternating switching commands such that the a first set of cells is acting like a short circuit and a second set of cells is providing a voltage through the charge stored in the capacitors in the cells. With a proper switching of the semiconductor devices in the cells it is possible to produce an AC current from a DC source or vice versa. E.g. a DC source may be applied between DC− and DC+ in FIG. 7 and a 3-phase AC source can be obtained on the three terminals extending on the left side of FIG. 7 and vice versa.

FIG. 8 shows a static synchronous compensator (STATCOM) modular multi-level converter (MMC). Such a converter may be operated according to methods of the present disclosure or form embodiments of the present disclosure. With a proper switching of the cells 700, that may be unipolar cells 500 or bipolar cells 600, it is possible e.g. to transfer power and in particular reactive power between phases of a 3-phase system in order to e.g. compensate an unbalance or to ensure voltage stability in the system.

In some embodiments the power electronic converter is a modular multi-level delta connected static synchronous compensator.

In some embodiments the power electronic converter is a modular multi-level direct 3-phase to 1-phase converter.

In some other embodiments the power electronic converter may be any converter configured to receive a 3-phase AC current or voltage as input and to produce a 3-phase AC current or voltage as output, e.g. receiving as input a 3-phase AC current with a variable frequency and/or a variable amplitude and producing as output a 3-phase AC current or voltage with a constant frequency, e.g. 50 Hz or 60 Hz and/or with a constant amplitude, e.g. a constant voltage or vice versa.

Therefore the present disclosure applies also to converters configured to convert 3-phase AC power/voltage/current to other 3-phase AC power/voltage/current with different characteristics, e.g. from variable frequency to constant frequency or vice versa. E.g. converters configured for conversion from 3-phase AC power/voltage/current to other 3-phase AC power/voltage/current may be used in pumped-storage hydroelectric plants. A generator in a pumped-storage hydroelectric plant may e.g. produce 3-phase AC currents with variable amplitude and/or frequency and it is therefore beneficial to use a 3-phase AC to 3-phase AC converter in order to produce as output a 3-phase AC current with constant frequency and amplitude. Furthermore the converter may be configured to balance unbalances and/or to produce a symmetric 3-phase AC output voltage or current.

Furthermore the present disclosure applies also to converters configured to convert a n-phase AC power/voltage/current to a m-phase AC power/voltage/current with different characteristics, e.g. from variable frequency or amplitude to constant frequency or amplitude or vice versa.

In some embodiments the power electronic converter includes unipolar cells.

In some embodiments the power electronic converter includes bipolar cells.

Methods described in the present disclosure allow for an improved control of a power electronic converter. In particular the consideration of an upper temperature threshold and a lower temperature threshold, that may be or not be different, allows for an adaptive control of the converter. When temperature of semiconductors in the converter is low, a second operation may gradually increase a current limit in order to obtain more power from the power converter without the risk of damages to the converter. When the temperature of semiconductors in the converter rises above an upper threshold a first operation reduces the current limit in order to prevent damages to the converter. The first and second operation are based on a past history of the temperature and may be further based on different moving averages and on the operating conditions of the converter. In this way the control is adapted to the converter and to the operation of the converter in order to maximize performance while minimizing the risk of damage. Further, using estimated values for the semiconductor temperatures, that can be further based on measured states or operating conditions of the converter, and with the consideration of physical models, allows for an improved knowledge about an actual condition of the semiconductors in the converter, in order to prevent damage that may otherwise result when the temperature is not known with the required precision and accuracy.

The consideration of threshold levels that may be different, together with the consideration of a plurality of information, e.g. the consideration of different moving averages of the temperature of semiconductor devices and/or the consideration of a maximum thereof, the use of a control based on historical values of the temperature or of a vector of temperatures formed by averaged temperatures or of a maximum thereof, the use of linear or nonlinear functions or of weights when adjusting the current limit, the consideration of relevant operating conditions or states and/or measured relevant data, allow a control fully tailored around a specific converter with the goal to ensure a safe operation without damage, while maximizing the power that the converter can deliver at various temperatures and under various load conditions.

The invention claimed is:

1. A method for operating a power electronic converter that comprises a power semiconductor device, the method comprising:
   determining a semiconductor temperature value based on a temperature of the power semiconductor device;
   comparing the semiconductor temperature value with an upper temperature threshold and a lower temperature threshold;
   determining a current limit of the power electronic converter by carrying out a first operation when the semiconductor temperature value is above the upper temperature threshold to always decrease the current limit from an immediately-previous current limit subject to an absolute lower floor current limit, carrying out a second operation when the semiconductor temperature value is below the lower temperature threshold to always increase the current limit from the immediately-previous current limit subject to an absolute upper ceiling current limit, and setting the current limit as the immediately-previous current limit when the semiconductor temperature value is not above the upper temperature threshold and not below the lower temperature threshold, wherein the first and second operations are respectively based on a current temperature of the power semiconductor device and a previous temperature value of the power semiconductor device, the previous temperature value being based on an accumulated or average of previous temperature values; and controlling the power electronic converter in order to maintain a current at or below the current limit.

2. The method of claim 1, wherein determining the semiconductor temperature value, determining the current limit, and controlling the power electronic converter are repeated iteratively.

3. The method of claim 2, wherein determining the semiconductor temperature value, determining the current limit, and controlling the power electronic converter are repeated iteratively within a loop and with a frequency that is greater than or equal to a minimum frequency in order to effectively control the temperature of the power semiconductor device in the power electronic converter.

4. The method of claim 1, wherein determining the semiconductor temperature value comprises estimating the temperature of the power semiconductor device.

5. The method of claim 1, further comprising storing a past value of the semiconductor temperature value, wherein determining the current limit uses the stored past value in determining the previous temperature value.

6. The method of claim 1, wherein:
performing the second operation comprises increasing the immediately-previous current limit at least if the immediately-previous current limit is below an absolute upper bound, and wherein the current limit is increased above a nominal value.

7. The method of claim 1, wherein performing the first operation comprises decreasing the immediately-previous current limit if the immediately-previous current limit is above an absolute lower bound such as zero, and wherein the current limit is decreased below a nominal value.

8. The method of claim 7, wherein the absolute lower bound is zero.

9. The method of claim 1, wherein the current limit is a phase current limit for one phase current in a polyphase power electronic converter.

10. The method of claim 1, wherein the current limit is an RMS (root mean square) current limit.

11. The method of claim 1, wherein determining the semiconductor temperature value comprises using a physical model of the power semiconductor device and of the power electronic converter, the physical model being represented by a function having a set of operating conditions or states of the power electronic converter as inputs and having the semiconductor temperature value and an output.

12. The method of claim 11, wherein the operating conditions or states comprise one or more of: currents flowing in the converter/the power semiconductor device, voltages in the converter/the power semiconductor device, semiconductor switching commands, a temperature of a cooling liquid or fluid, a flow of the cooling liquid or fluid, a pressure of the cooling liquid or fluid, a glycol content of the cooling liquid, an ambient temperature, and measured temperatures in the power electronic converter.

13. The method of claim 11, wherein determining the semiconductor temperature value comprises measuring the semiconductor temperature value.

14. A power electronic converter comprising:
a power semiconductor device;
a controller; and
a memory coupled to the controller and storing instructions that, when executed by the controller, cause the controller to:
estimate a semiconductor temperature value of the power semiconductor device;
compare the semiconductor temperature value with an upper temperature threshold and a lower temperature threshold;
determine a current limit of the power electronic converter by carrying out a first operation when the semiconductor temperature value is above the upper temperature threshold to always decrease the current limit from a immediately-previous current limit subject to an absolute lower floor current limit, carrying out a second operation when the semiconductor temperature value is below the lower temperature threshold to always increase the current limit from the immediately-previous current limit subject to an absolute upper ceiling current limit, and setting the current limit as the immediately-previous current limit when the semiconductor temperature value is not above the upper temperature threshold and not below the lower temperature threshold, wherein the first and second operations are respectively based on a current temperature of the power semiconductor device and a previous temperature value of the power semiconductor device, the previous temperature value being based on an accumulated or average of previous temperature values; and
control the power electronic converter in order to maintain a current at or below the current limit.

15. The power electronic converter of claim 14, wherein the power electronic converter is a modular multi-level delta connected static synchronous compensator.

16. The power electronic converter of claim 14, wherein the power electronic converter is a modular multi-level direct 3-phase to 1-phase converter.

17. The power electronic converter of claim 14, wherein the power electronic converter comprises unipolar cells.

18. The power electronic converter of claim 14, wherein the power electronic converter comprises bipolar cells.

19. The power electronic converter of claim 14, wherein the semiconductor temperature value is estimated using a physical model of the power semiconductor device and of the power electronic converter, the physical model being represented by a function having a set of operating conditions or states of the power electronic converter as an input and having the semiconductor temperature value as an output.

20. The power electronic converter of claim 19, further comprising a cooling system configured to flow a cooling liquid or fluid, wherein the operating conditions or states comprise one or more of: a temperature of the cooling liquid or fluid, a flow of the cooling liquid or fluid, a pressure of the cooling liquid or fluid, and a glycol content of the cooling liquid or fluid.

* * * * *

UNITED STATES PATENT AND TRADEMARK OFFICE
CERTIFICATE OF CORRECTION

PATENT NO. : 12,283,878 B2
APPLICATION NO. : 17/613377
DATED : April 22, 2025
INVENTOR(S) : Beanato et al.

Page 1 of 1

It is certified that error appears in the above-identified patent and that said Letters Patent is hereby corrected as shown below:

In the Claims

In Column 19, Line 56, Claim 11:
Change "having the semiconductor temperature value and an output."
To --having the semiconductor temperature value as an output.--

Signed and Sealed this
Third Day of June, 2025

Coke Morgan Stewart
*Acting Director of the United States Patent and Trademark Office*